(12) United States Patent
Yoneyama et al.

(10) Patent No.: US 9,632,423 B2
(45) Date of Patent: Apr. 25, 2017

(54) ILLUMINATION DEVICE, EXPOSURE APPARATUS, ADJUSTING METHOD, AND METHOD FOR MANUFACTURING OBJECT

(71) Applicant: CANON KABUSHIKI KAISHA, Tokyo (JP)

(72) Inventors: Yoshikuni Yoneyama, Utsunomiya (JP); Kentaro Hiruma, Saitama (JP); Noboru Osaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/740,071

(22) Filed: Jun. 15, 2015

(65) Prior Publication Data

US 2015/0362843 A1 Dec. 17, 2015

(30) Foreign Application Priority Data

Jun. 17, 2014 (JP) .................................. 2014-124752

(51) Int. Cl.
*G03B 27/54* (2006.01)
*G03F 7/20* (2006.01)
*G02B 19/00* (2006.01)

(52) U.S. Cl.
CPC ..... *G03F 7/70141* (2013.01); *G02B 19/0028* (2013.01); *G02B 19/0047* (2013.01);
(Continued)

(58) Field of Classification Search
CPC ............ G02B 19/0028; G02B 19/0047; G03F 7/70091; G03F 7/701;
(Continued)

(56) References Cited

U.S. PATENT DOCUMENTS

| | | | | |
|---|---|---|---|---|
| 5,305,054 A | * | 4/1994 | Suzuki | G03F 7/7005 355/53 |
| 2001/0055103 A1 | * | 12/2001 | Nishi | G03F 7/70066 355/53 |

(Continued)

FOREIGN PATENT DOCUMENTS

| | | |
|---|---|---|
| CN | 1199086 C | 4/2005 |
| CN | 101276156 A | 10/2008 |

(Continued)

*Primary Examiner* — Christina Riddle
(74) *Attorney, Agent, or Firm* — Canon U.S.A. Inc., IP Division

(57) ABSTRACT

An illumination device includes a plurality of light source units, each including a light source, a mirror that reflects light from the light source, and one or more light blocking members that block the light that is reflected by the mirror and travels toward the illumination surface; and an illumination optical system that forms a light intensity distribution of superposed light, in which the light from each of the light source units is superposed, in a pupil plane and illuminates the illumination surface with the superposed light. In the light intensity distribution in the pupil plane of the illumination optical system, positions of shadows of all of the light blocking members included in one of the light source units are separated from positions of shadows of all of the light blocking members included in at least one of the remaining light source units.

22 Claims, 13 Drawing Sheets

(52) U.S. Cl.
CPC ........ *G03F 7/7005* (2013.01); *G03F 7/70091* (2013.01); *G03F 7/70133* (2013.01)

(58) Field of Classification Search
CPC .......... G03F 7/70008–7/7005; G03F 7/70133; G03F 7/70141; G03F 7/70175; G03F 7/70208; G03F 7/70558; G03F 7/7085; G03F 7/70883; G03F 7/70891
USPC ............... 355/30, 46, 53, 52, 55, 67–71, 77; 250/492.1, 492.2, 492.22, 493.1, 548; 362/225, 217.02, 217.05, 227, 234, 235, 362/239, 242, 243, 247, 248, 296.01, 297, 362/341, 345, 351
See application file for complete search history.

(56) References Cited

U.S. PATENT DOCUMENTS

| | | | |
|---|---|---|---|
| 2004/0021845 A1* | 2/2004 | Kawahara | G03F 7/70108 355/67 |
| 2010/0118287 A1* | 5/2010 | Kikuchi | H01J 5/54 355/69 |
| 2010/0259740 A1* | 10/2010 | Kemmoku | G03F 7/70091 355/67 |

FOREIGN PATENT DOCUMENTS

| | | |
|---|---|---|
| CN | 101548132 A | 9/2009 |
| JP | H03-166712 A | 7/1991 |
| JP | 2001-326171 A | 11/2001 |
| JP | 2008-262911 A | 10/2008 |

* cited by examiner

ILLUMINATION DEVICE, EXPOSURE APPARATUS, ADJUSTING METHOD, AND METHOD FOR MANUFACTURING OBJECT

BACKGROUND OF THE INVENTION

Field of the Invention

The present invention relates to an illumination device, an exposure apparatus, an adjusting method, and a method for manufacturing an object.

Description of the Related Art

An exposure apparatus is used in a lithography process for manufacturing a semiconductor device, a liquid crystal display device, or the like. The exposure apparatus illuminates a mask (reticle) so that a pattern of the mask is transferred onto a substrate (wafer, glass plate, or the like), to which a photosensitive material (resist) is applied, through a projection optical system.

With regard to, for example, projection exposure apparatuses that transfer a pattern onto a glass plate, in recent years, there has been a demand for an exposure apparatus capable of performing full-plate exposure in which a pattern of a mask having a large area is transferred onto a substrate. To meet such a demand, a step-and-scan (scanning) projection exposure apparatus, with which high resolution can be achieved and a large area can be subjected to exposure, has been proposed. In the scanning exposure apparatus, the mask is illuminated with exposure light that has passed through a slit while the mask and the substrate are being moved. Thus, the pattern of the mask is transferred onto the substrate by scanning the substrate with the exposure light through the projection optical system.

Japanese Patent Laid-Open No. 2001-326171 describes a technology for increasing the energy of light for illuminating the mask to increase the productivity of the scanning exposure apparatus. More specifically, an illumination optical system is described in which light beams emitted from three light source units are incident on a collimator in such a manner that the light beams are arranged next to each other. The collimator superposes the light beams from the three light source units into light that illuminates the mask.

Japanese Patent Laid-Open No. 2008-262911 describes a light source unit in which part of light that is focused by an ellipsoidal mirror and travels toward a mask is blocked by an electrode line of a mercury lamp and a cooling nozzle that suppresses heating of the light source unit. It is also described that the electrode line of the light source unit and the cooling nozzle may be integrated together to reduce loss in the amount of light caused by the electrode line and the cooling nozzle in the light source unit.

When part of the light that is focused by the ellipsoidal mirror and that travels toward the mask is blocked by light blocking members, such as the electrode line of the light source unit and the cooling nozzle, shadows of the light blocking members are formed in a light intensity distribution (effective light source distribution) on a pupil plane of the illumination optical system, which is downstream of the light source unit.

In the case where a plurality of light source units are used for the exposure of the substrate, the shadows of the light blocking members included in the light source units may overlap in the effective light source distribution, and be collected in a region in a certain direction from the center of the effective light source distribution. In such a case, uniformity of the effective light source distribution is degraded. Therefore, there is a risk that a line width of a pattern formed on the substrate will be different from the desired value or be non-uniform, and there is also a risk that the resolution of the pattern will be reduced. In addition, the resolution will vary depending on the direction of the pattern of the mask. For example, consider a case in which a mask pattern including pattern elements that are arranged periodically in an X direction and pattern elements that are arranged periodically in a Y direction, which is perpendicular to the X direction, is illuminated. In such a case, when the shadows of the light blocking members extend only in the X direction in the effective light source distribution, line widths of the pattern elements projected onto the substrate differ between the X direction and the Y direction.

The above-described problems are not described in Japanese Patent Laid-Open No. 2001-326171 or Japanese Patent Laid-Open No. 2008-262911, and means for solving the problems is also not described.

SUMMARY OF THE INVENTION

According to an aspect of the present invention, an illumination device that illuminates an illumination surface includes a plurality of light source units, each including a light source, a mirror that reflects light from the light source, and one or more light blocking members that block the light that is reflected by the mirror and travels toward the illumination surface; and an illumination optical system that forms a light intensity distribution of superposed light, in which the light from each of the light source units is superposed, in a pupil plane and illuminates the illumination surface with the superposed light. In the light intensity distribution in the pupil plane of the illumination optical system, positions of shadows of all of the light blocking members included in one of the light source units are separated from positions of shadows of all of the light blocking members included in at least one of the remaining light source units.

Further features of the present invention will become apparent from the following description of exemplary embodiments with reference to the attached drawings.

DESCRIPTION OF THE EMBODIMENTS

First Embodiment

Figure 1:
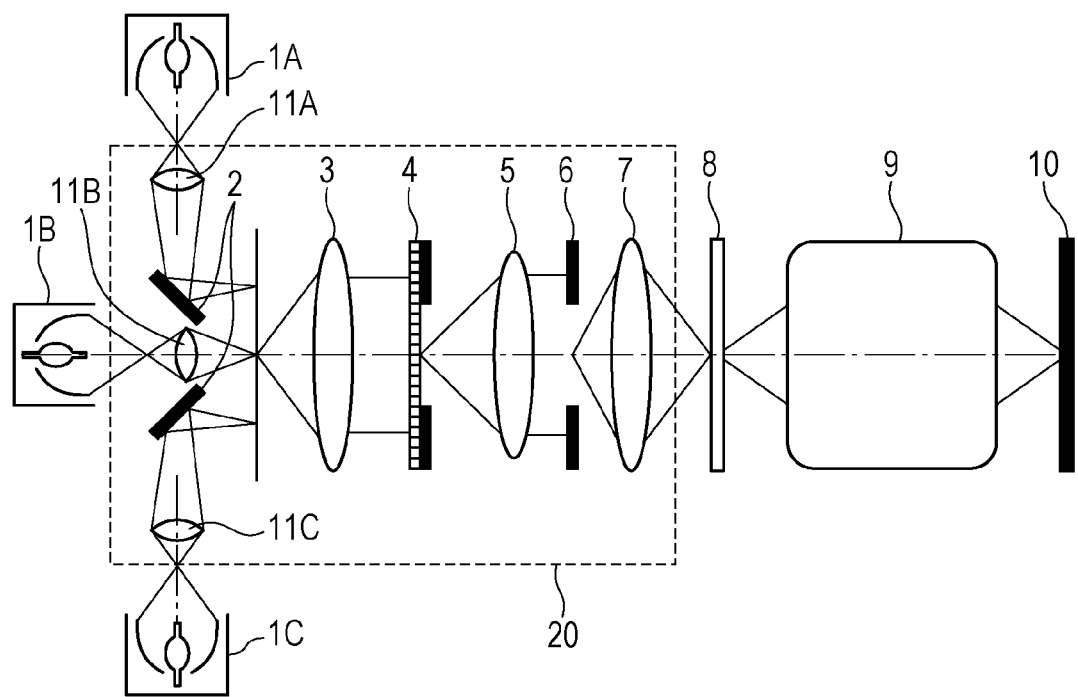
FIG. 1 is a schematic diagram of an exposure apparatus according to a first embodiment.

FIG. 1 is a schematic diagram illustrating an exposure apparatus. The exposure apparatus illuminates a mask (reticle) 8 disposed in an illumination plane with light emitted from a light source device, and projects a pattern of the mask 8 onto a substrate (wafer, glass plate, or the like) 10 with a projection optical system 9, so that the pattern is transferred onto the substrate 10.

Figure 2:
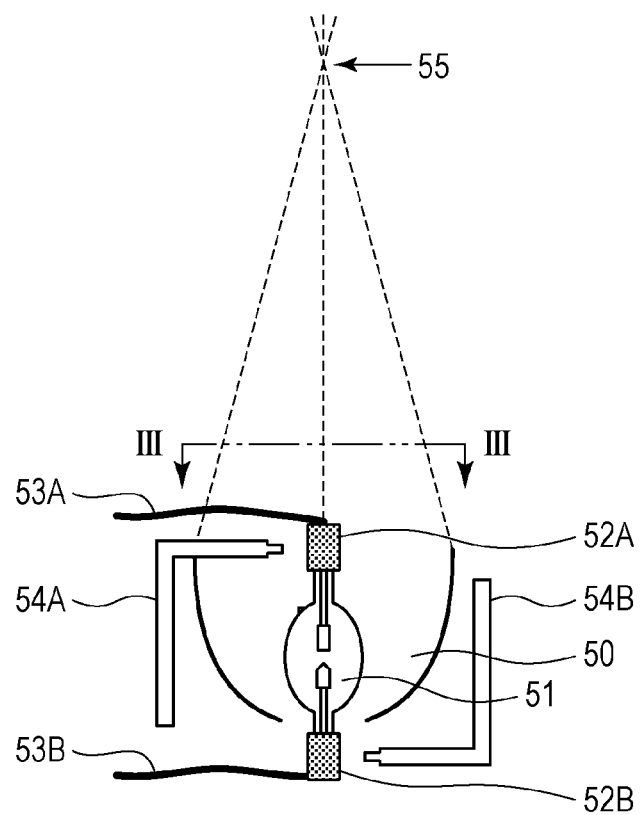
FIG. 2 is a detailed diagram of a light source unit.

The light source device includes a plurality of light source units 1A, 1B, and 1C. FIG. 2 is a detailed diagram illustrating the structure of each light source unit. Each light source unit includes a mercury lamp 51, an ellipsoidal mirror (concave mirror) 50 that focuses light emitted from the mercury lamp 51, a cable 53A connected to an anode (electrode) 52A of the mercury lamp 51, and a cable 53B connected to a cathode (electrode) 52B of the mercury lamp 51. The mercury lamp 51 emits light when an ultra-high voltage is applied between the anode 52A and the cathode 52B. When the light is emitted, the mercury lamp 51 itself emits heat, so that the temperature of the region around the mercury lamp 51 is increased to around 600° C. If the temperature is further increased, the bulb of the mercury lamp will break. In particular, the temperatures of the anode 52A (base) and the cathode 52B (base) of the mercury lamp 51 are easily increased. To suppress the temperature increase at these portions, the light source unit includes a cooling nozzle 54A for cooling the anode 52A and a cooling nozzle 54B for cooling the cathode 52B. Compressed cooling air is blown from the cooling nozzles toward the anode 52A and the cathode 52B, so that the temperature of the mercury lamp 51 can be maintained at a desired temperature. The ellipsoidal mirror 50 and the mercury lamp 51 are arranged so that a primary focal point of the ellipsoidal mirror 50 coincides with a light emitting point of the mercury lamp 51. The light emitted from the mercury lamp 51 is focused by the ellipsoidal mirror 50 at a secondary focal point 55.

The exposure apparatus includes an illumination optical system 20 that illuminates the mask 8 with light beams emitted from the light source units 1A, 1B, and 1C. The illumination optical system 20 includes lenses 11A, 11B, and 11C and components from mirrors 2 to an image-forming optical system 7. The light beams emitted from the light source units 1A, 1B, and 1C pass through respective lenses 11A, 11B, and 11C. The light beams that have passed through the lenses 11A and 11C are reflected by the respective deflecting mirrors 2 so that optical paths thereof are bent. Then, the light beams from the respective light source units are combined together by a Fourier transform optical system (collimator) 3. More specifically, the Fourier transform optical system 3 guides the light beams reflected by the deflecting mirrors 2 and the light beam that has passed through the lens 11B to a fly-eye lens 4. The Fourier transform optical system 3 is arranged so that an incident surface of the fly-eye lens 4 is in a Fourier plane conjugate to (plane having a Fourier transform relationship with) the secondary focal points of the ellipsoidal mirrors 50 included in the light source units 1A, 1B, and 1C. Accordingly, the Fourier transform optical system 3 enables the light beams from the respective light source units to be incident on the incident surface of the fly-eye lens 4 in substantially the same region, and thus the light beams from the respective light source units are superposed.

The exit surface of the fly-eye lens 4 serves as a pupil plane of the illumination optical system. Here, the light intensity distribution in the pupil plane is referred to as an effective light source distribution. The light beams that are emitted from the respective light source units and superposed form the light intensity distribution in the pupil plane. Light emitted from the exit surface of the fly-eye lens 4 passes through a Fourier transform optical system 5, and is incident on a field stop 6 having a slit (opening). The image-forming optical system 7 and the projection optical system 9 are arranged such that the field stop 6, the mask 8, and the substrate 10 are optically conjugate to each other. Thus, the effective light source distribution corresponds to an angle distribution of light incident on the mask 8 at a single point. The mask 8 is illuminated with the light that has passed through the slit, and the pattern of the mask 8 is projected onto the substrate 10 by the projection optical system 9. The light source units 1A, 1B, and 1C and the illumination optical system 20 form the illumination device that illuminates the mask (illumination surface).

Figure 3A:
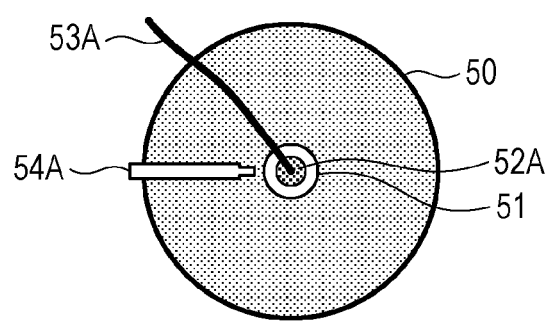
FIG. 3A illustrates the light source unit viewed from line III-III in FIG. 2 in the direction shown by the arrows.
Figure 3B:
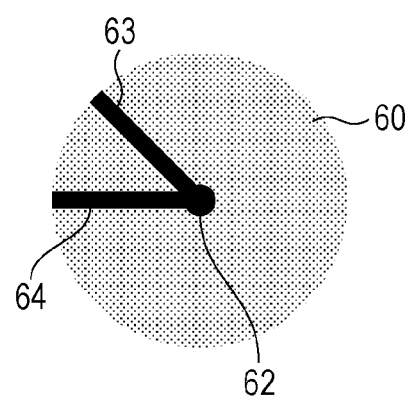
FIG. 3B illustrates a light intensity distribution of a light beam emitted from the light source unit along a cross section taken along line III-III in FIG. 2.

FIG. 3A illustrates a light source unit viewed from line III-III in FIG. 2 in the direction shown by the arrows. The light emitted from the mercury lamp 51 is reflected by the ellipsoidal mirror 50, and then travels toward the corresponding one of the lenses 11A, 11B, and 11C. At this time, portions of the light are blocked by the cooling nozzle 54A (light blocking member) and the cable 53A (light blocking member). Therefore, shadows of the cooling nozzle 54A and the cable 53A are formed in the effective light source distribution. FIG. 3B illustrates the light intensity distribution of the light beam along the cross section taken along line III-III in FIG. 2. The circular light intensity distribution includes a shadow 63 of the cable 53A and a shadow 64 of the cooling nozzle 54A in addition to a region 60 having a certain light intensity. Therefore, the effective light source distribution includes shadows of the cable 53A and the cooling nozzle 54A, where the light intensity is lower than that in the region 60. To simplify the description, assume that the light intensity in the region 60 is 100% and the light intensity in the shadows 63 and 64 is 0%. The anode 52A of the mercury lamp 51 also blocks a portion of the light emitted from the light-emitting point of the mercury lamp 51, so that a shadow 62 of the anode 52A is formed at the center of the effective light source distribution. However, since the anode 52A is a component of the mercury lamp 51, the shadow of the anode 52A of the mercury lamp 51 is distinguished from the shadows of the light blocking members that block the light that is emitted from the mercury lamp 51, is reflected by the ellipsoidal mirror 50, and travels toward the mask.

The exposure apparatus includes the three light source units 1A, 1B, and 1C. Since each of the light source units 1A, 1B, and 1C includes the cooling nozzle 54A and the cable 53A, the effective light source distribution includes the shadows of the cooling nozzle 54A and the cable 53A of each of the light source units.

Figure 4A:
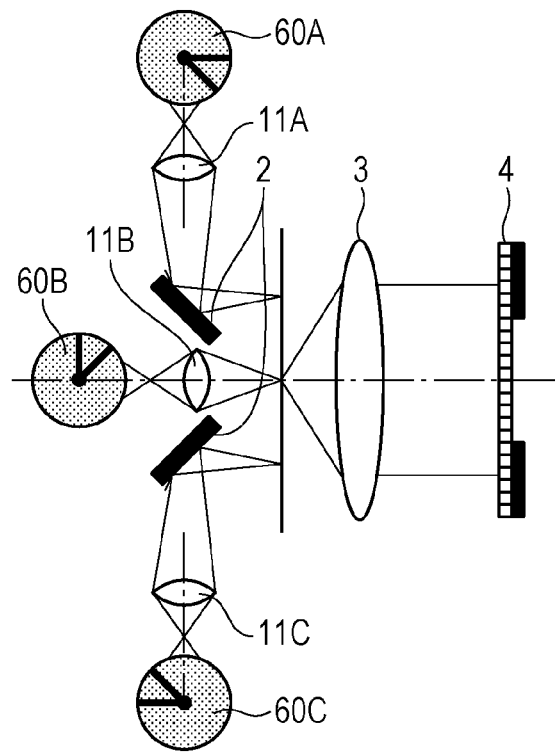
FIG. 4A illustrates an arrangement of light source units according to a comparative example.
Figure 4B:
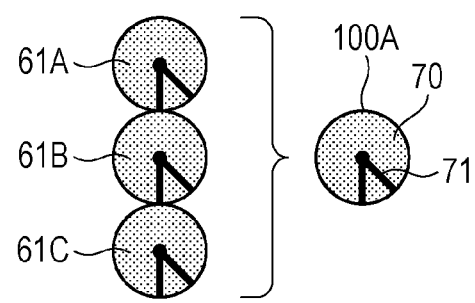
FIG. 4B illustrates a light intensity distribution in a pupil plane of an illumination optical system according to the comparative example.

First, a comparative example will be described. FIGS. 4A and 4B illustrate the comparative example. Referring to FIG. 4A, the light source units 1A, 1B, and 1C are arranged such that the light beams emitted from the light source units 1A, 1B, and 1C have light intensity distributions 60A, 60B, and 60C, respectively, along cross sections thereof. As described above, the light intensity distributions 60A, 60B, and 60C each include the shadows of the light blocking members (black regions). Owing to inversions and rotations caused by lenses and mirrors when the light beams travel from the light source units 1A, 1B, and 1C to the fly-eye lens 4, as illustrated in FIG. 4B, the light intensity distributions 60A, 60B, and 60C are converted into light intensity distributions 61A, 61B, and 61C, respectively, in the pupil plane of the illumination optical system. The effective light source distribution is the combination of the light intensity distributions 61A, 61B, and 61C, and is defined as a light intensity distribution 100A obtained by adding the light intensity distributions 61A, 61B, and 61C together. The light intensity distribution 100A includes a region 70 in which the light intensity is 300% and shadow regions 71 in which the light intensity is 0%. Thus, the light intensity is not uniform. When the mask is illuminated with light having such a non-uniform effective light source distribution and the pattern of the mask is transferred onto the substrate by the exposure process, satisfactory resolution (light width, light-width uniformity, focusing, distortion, etc.) cannot be obtained.

Next, examples of the present embodiment will be described.

First Example

Figure 5A:
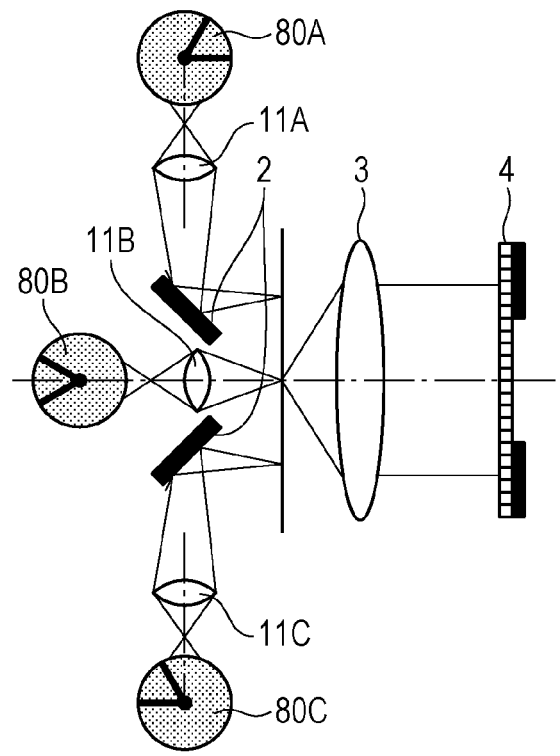
FIG. 5A illustrates an arrangement of light source units according to a first example.
Figure 5B:
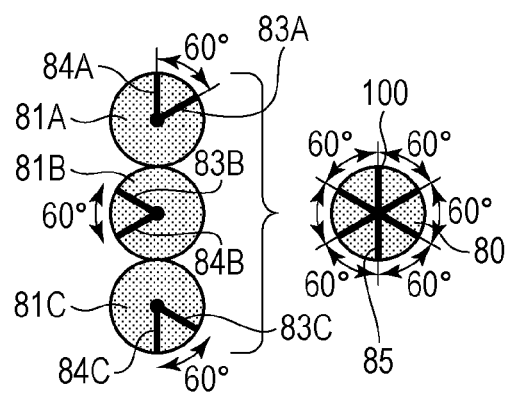
FIG. 5B illustrates a light intensity distribution in a pupil plane of an illumination optical system according to the first example.

Referring to FIG. 5A, the light source units 1A, 1B, and 1C are arranged such that the light beams emitted from the light source units 1A, 1B, and 1C have light intensity distributions 80A, 80B, and 80C, respectively, along cross sections thereof. Similar to the comparative example, the light intensity distributions 80A, 80B, and 80C each include the shadows of the light blocking members (black regions). However, in this example, the positions of the shadows of the light blocking members are different from those in the comparative example. In each of the light intensity distributions 80A, 80B, and 80C, the shadow of the cable 53A and the shadow of the cooling nozzle 54A are separated from each other by a central angle of 60°. Owing to inversions and rotations caused by lenses and mirrors when the light beams travel from the light source units 1A, 1B, and 1C to the fly-eye lens 4, as illustrated in FIG. 5B, the light intensity distributions 80A, 80B, and 80C are converted into light intensity distributions 81A, 81B, and 81C, respectively, in the pupil plane of the illumination optical system. The effective light source distribution is the combination of the light intensity distributions 81A, 81B, and 81C, and is defined as a light intensity distribution 100 obtained by adding the light intensity distributions 81A, 81B, and 81C together. In the light intensity distribution 100, the shadows of the light blocking members are separated from each other by an equal central angle of 60°.

In this example, in the light intensity distribution of the combined light in the pupil plane of the illumination optical system, the positions of the shadows of the light blocking members included in one of the light source units are separated from the positions of the shadows of the light blocking members included in the other light source units. More specifically, in the effective light source distribution, the positions of shadows 83A and 84A of the light blocking members included in the light source unit 1A are separated from the positions of shadows 83B and 84B of the light blocking members included in the light source unit 1B and from the positions of shadows 83C and 84C of the light blocking members included in the light source unit 1C. Therefore, the light intensity distribution 100 includes regions 80 in which the light intensity is 300% and regions 85 of the light blocking members (black regions) in which the light intensity is 200%. Since the positions of the shadows are separated from each other in the effective light source distribution in this way, uniformity of the light intensity in the effective light source distribution is improved. As a result, reduction in the resolution of the pattern of the mask due to the shadows of the light blocking members of the light source units can be suppressed.

Second Example

Figure 6A:
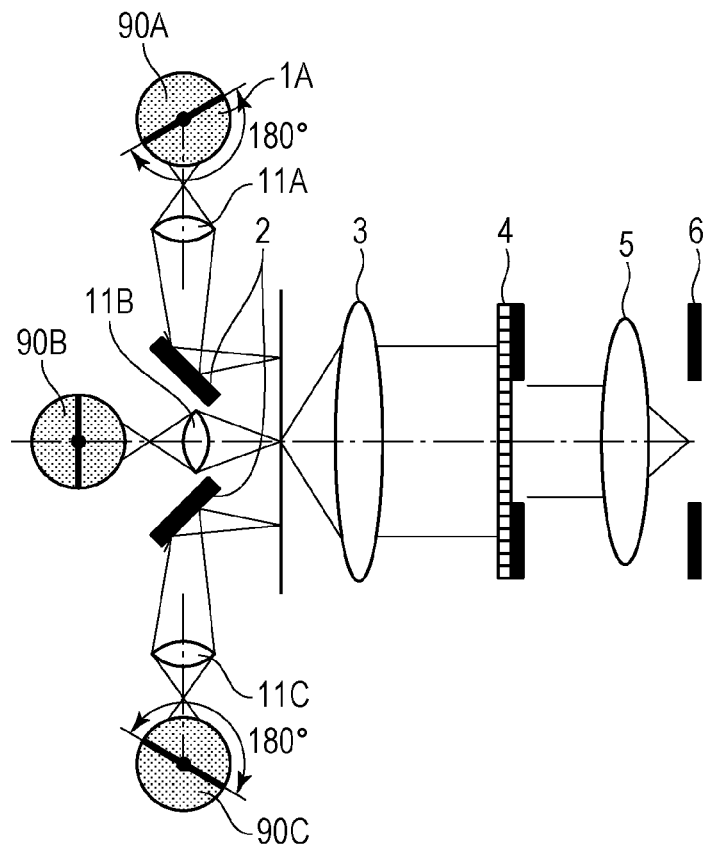
FIG. 6A illustrates an arrangement of light source units according to a second example.
Figure 6B:
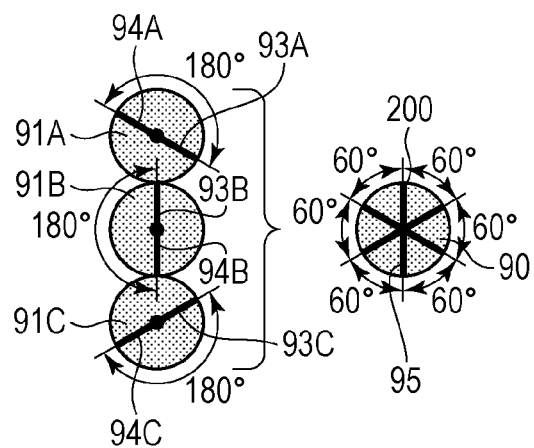
FIG. 6B illustrates a light intensity distribution in a pupil plane of an illumination optical system according to the second example.

Referring to FIG. 6A, the light source units 1A, 1B, and 1C are arranged such that the light beams emitted from the light source units 1A, 1B, and 1C have light intensity distributions 90A, 90B, and 90C, respectively, along cross sections thereof. The light intensity distributions 90A, 90B, and 90C each include the shadows of the light blocking members (black regions). In the first example, the angle between the cooling nozzle 54A and the cable 53A in each light source unit is 60°. However, in this example, the cooling nozzle 54A and the cable 53A of each light source unit are arranged so as to oppose each other, that is, with an angle of 180° therebetween. Accordingly, in this example, the positions of shadows of the light blocking members are different from those in the first example. In each of the light intensity distributions 90A, 90B, and 90C, the shadow of the cable 53A and the shadow of the cooling nozzle 54A are separated from each other by a central angle of 180°. Owing to inversions and rotations caused by lenses and mirrors when the light beams travel from the light source units 1A, 1B, and 1C to the fly-eye lens 4, as illustrated in FIG. 6B, the light intensity distributions 90A, 90B, and 90C are converted into light intensity distributions 91A, 91B, and 91C, respectively, in the pupil plane of the illumination optical system. The effective light source distribution is the combination of the light intensity distributions 91A, 91B, and 91C, and is defined as a light intensity distribution 200 obtained by adding the light intensity distributions 91A, 91B, and 91C together. Similar to the light intensity distribution 100 in the first example, in the light intensity distribution 200, the shadows of the light blocking members are separated from each other by an equal central angle of 60°.

In this example, similar to the first example, in the light intensity distribution of the combined light in the pupil plane of the illumination optical system, the positions of the shadows of the light blocking members included in one of the light source units are separated from the positions of the shadows of the light blocking members included in the other light source units. More specifically, in the effective light source distribution, the positions of shadows 93A and 94A of the light blocking members included in the light source unit 1A are separated from the positions of shadows 93B and 94B of the light blocking members included in the light source unit 1B and from the positions of shadows 93C and 94C of the light blocking members included in the light source unit 1C. Thus, similar to the first example, uniformity of the light intensity in the effective light source distribution is improved. As a result, reduction in the resolution of the pattern of the mask can be suppressed.

Figure 7:
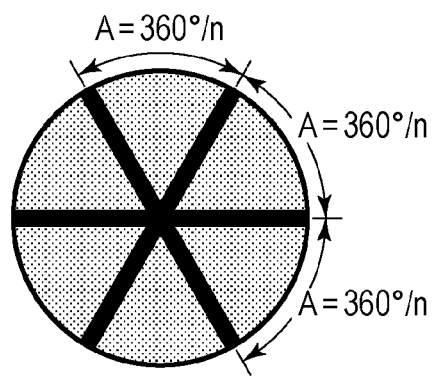
FIG. 7 illustrates the positions of shadows in an effective light source distribution.

In the first and second examples, the illumination device includes a plurality of light source units. The number of light source units is three, and the number of light blocking members included in each light source unit is two. However, the numbers of the components are not limited to this. Assume that each of the cooling nozzle 54A and the cable 53A is a light blocking member that forms a single shadow, and that the number of light blocking members included in each light source unit is m (integer) and the number of light source units is k (integer). When the shadows of all of the light blocking members are separated from each other so as not to overlap in the effective light source distribution, the number of shadows is n=m×k. As illustrated in FIG. 7, the positions of the shadows may be separated from each other by an equal central angle of A=360°/n.

Figure 8:
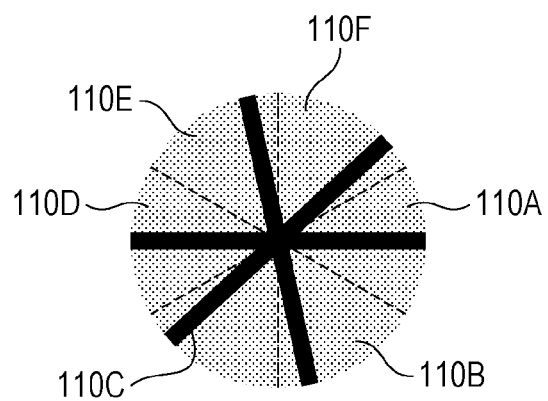
FIG. 8 illustrates the positions of shadows in an effective light source distribution.

It is not necessary that the shadows be separated from each other by an exactly equal central angle as illustrated in FIG. 7, and the shadows may instead be separated from each other by different angles. For example, as illustrated in FIG. 8, the pupil plane of the illumination optical system may be evenly divided into n regions 110A to 110F having a central angle of 360°/n, and the light blocking members included in the light source units may be arranged such that the shadows thereof are individually disposed in the respective regions. When the shadows of the light blocking members in the effective light source distribution are separated from each other by a central angle that is greater than or equal to one-half of 360°/n, that is, 180°/n, the shadows are not collected locally in the effective light source distribution.

In the case where the direction in which the current flows in each light source unit is reversed, the cathode and the anode are vertically inverted. Therefore, the positions of the cooling nozzle 54A for the anode 52A, the cable 53A connected to the anode 52A, the cooling nozzle 54B for the cathode 52B, and the cable 53B connected to the cathode 52B are vertically inverted from those in FIG. 2. In this case, the cooling nozzle 54B and the cable 53B serve as light blocking members that block the light that is reflected by the ellipsoidal mirror 50 and travels toward the mask.

Figure 9A:
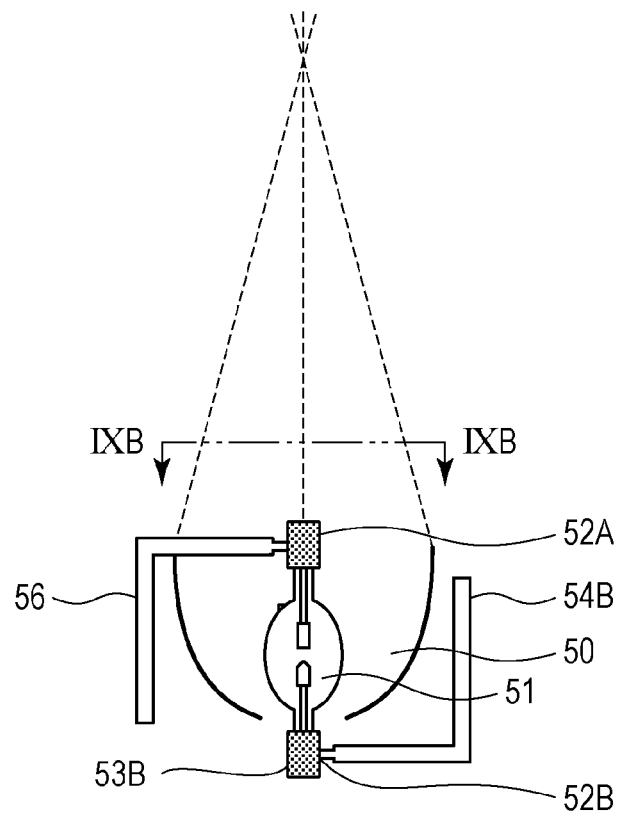
FIG. 9A illustrates light blocking members of a light source unit according to a modification.
Figure 9B:
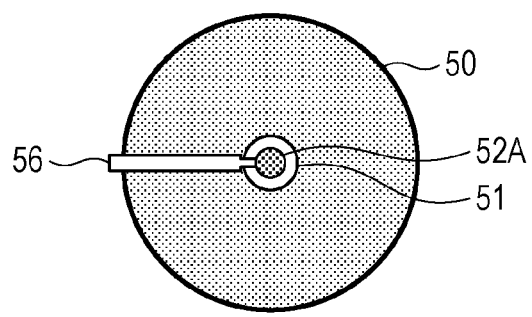
FIG. 9B illustrates the light source unit viewed from line IXB-IXB in the direction shown by the arrows.

As described in Japanese Patent Laid-Open No. 2008-262911, each light source unit may include a member in which a cooling nozzle and a cable are integrated together. FIG. 9A illustrates a light source unit in including a member in which a cooling nozzle and a cable are integrated together. The light source unit includes a member 56 (light blocking member) including a cooling nozzle 54A and a cable 53A contained in the cooling nozzle 54A. FIG. 9B illustrates the light source unit viewed from line IXB-IXB in the direction shown by the arrows. Since the cooling nozzle and the cable are integrated together, the light intensity distribution of the light beam reflected by the ellipsoidal mirror 50 along a cross section thereof includes a single shadow of the integrated member. Thus, compared to the case in which the cooling nozzle and the cable are separated from each other and form two shadows, loss in the amount of light from the light source unit can be reduced. Also in this case, the light source units are arranged so that, in the effective light source distribution, the position of the shadow of the light blocking member, in which the cooling nozzle and the cable are integrated together, of each light source unit is separated from the positions of the shadows of the light blocking members included in the other light source units, as in the first and second examples.

Figure 10A:
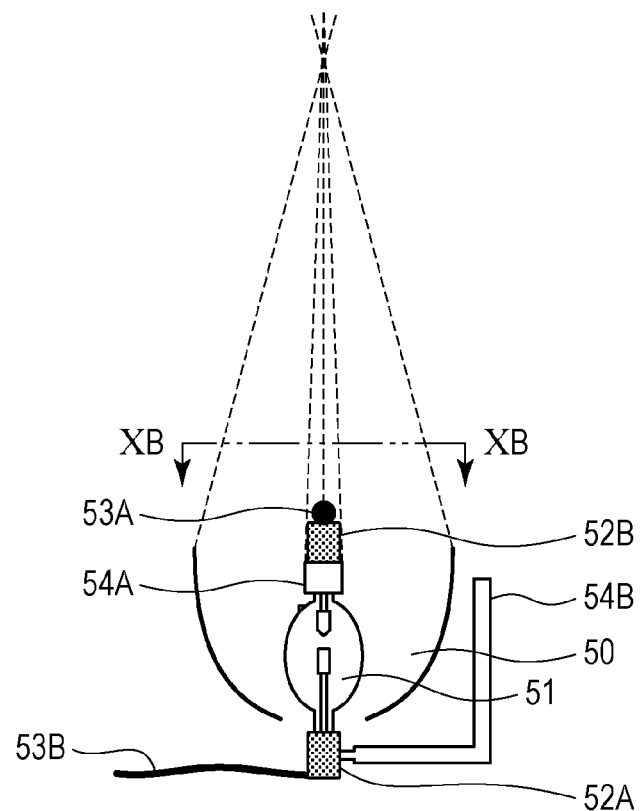
FIG. 10A illustrates light blocking members of a light source unit according to a modification.
Figure 10B:
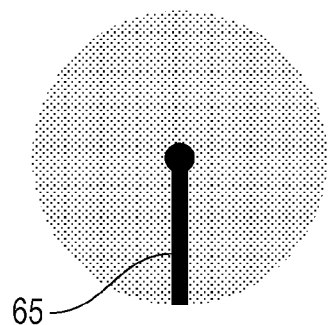
FIG. 10B illustrates a light intensity distribution of a light beam emitted from the light source unit along a cross section taken along line XB-XB.

Even when the cooling nozzle and the cable are separate components, the cooling nozzle and the cable may be arranged in each light source unit such that the shadow of the cooling nozzle and the shadow of the cable overlap in the effective light source distribution. For example, as illustrated in FIGS. 10A and 10B, the cooling nozzle 54A and the cable 53A may be arranged such that the shadow of the cooling nozzle 54A and the shadow of the cable 53A overlap so as to form a single shadow 65. The cooling nozzle 54A and the cable 53A that form the shadow may have the same width. When the cooling nozzle 54A and the cable 53A cannot be structured so as to have the same width, the relative position between the cooling nozzle 54A and the cable 53A in the direction in which the light travels may be adjusted in advance so that the shadow of the cooling nozzle 54A and the shadow of the cable 53A have the same width in the effective light source distribution. The direction in which the light travels is the direction parallel to a line that connects the primary and secondary focal points of the ellipsoidal mirror 50.

Second Embodiment

Figure 11:
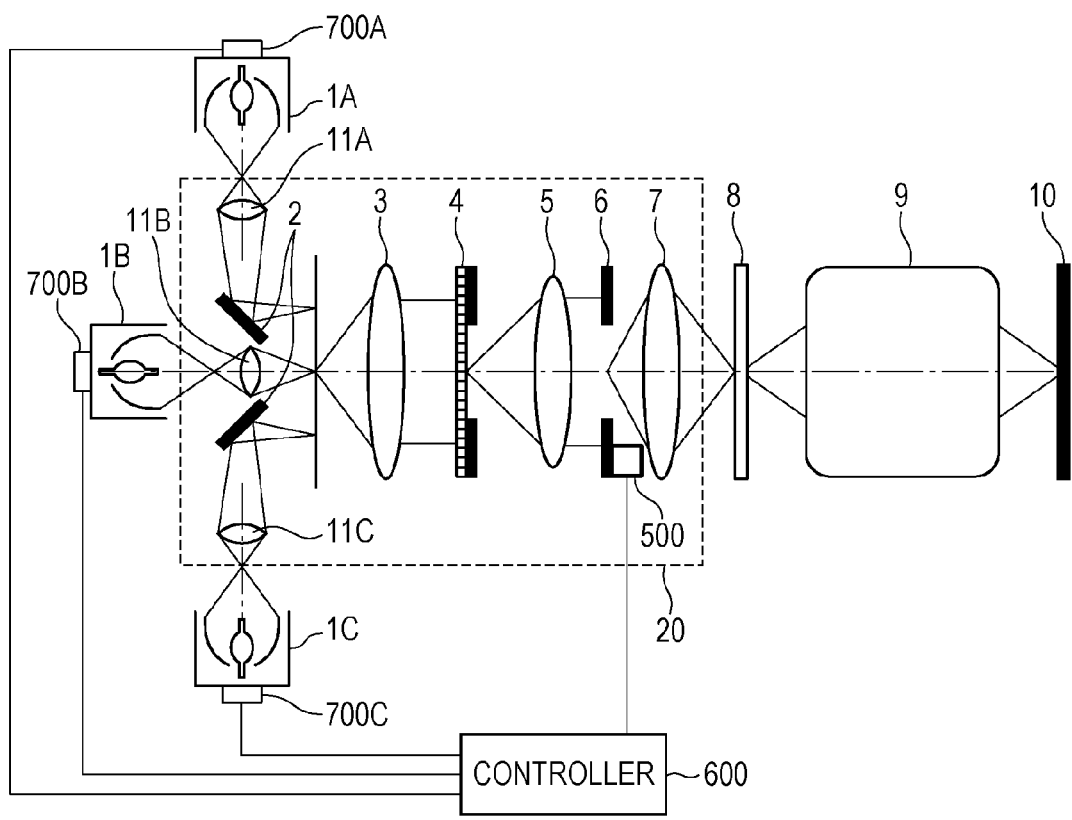
FIG. 11 is a schematic diagram illustrating an exposure apparatus according to a second embodiment.

FIG. 11 is a schematic diagram illustrating an exposure apparatus according to a second embodiment. The exposure apparatus according to the present embodiment differs from the exposure apparatus according to the first embodiment in that a measurement unit 500 and an adjusting unit (controller 600 and adjusting mechanisms 700A, 700B, and 700C) are provided. Descriptions of structures similar to those in the first embodiment are omitted.

In the present embodiment, the field stop 6 includes a light shielding plate that is provided with the measurement unit 500, which measures the effective light source distribution. The measurement unit 500 measures the light that has passed through a pinhole (opening) in the light shielding plate of the field stop 6 with image pickup elements (CODs or the like) that are two-dimensionally arranged. A light intensity distribution is formed on the image pickup elements in accordance with the angle distribution of light that is incident on the pinhole (light beam intensity for each incident angle). Therefore, the light intensity distribution measured by the image pickup devices corresponds to the effective light source distribution. The illumination device according to the present embodiment also includes the controller 600 and the adjusting mechanisms 700A, 700B, and 700C that adjust the angles and positions of the light source units 1A, 1B, and 1C. The adjustment mechanism is driven in accordance with control commands issued by the controller 600.

Figure 12:
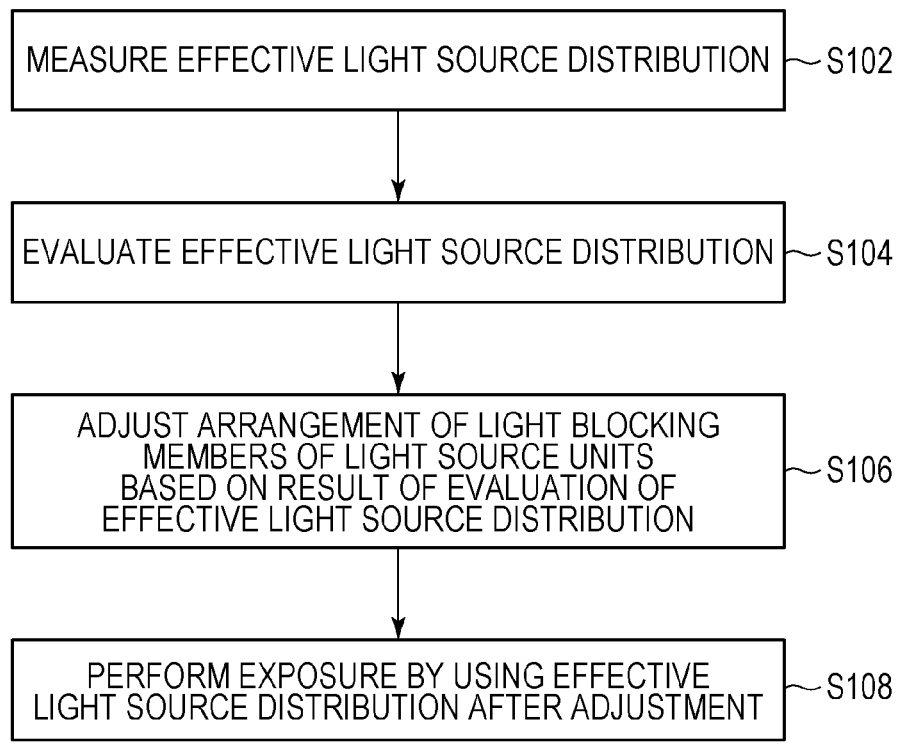
FIG. 12 is a flowchart of an adjusting method according to the second embodiment.

A method for adjusting the illumination device will now be described. FIG. 12 is a flowchart of the adjusting method. First, in step S102, the effective light source distribution is measured by using the measurement unit 500. Next, in step S104, the controller 600 evaluates the effective light source distribution measured by the measurement unit 500. The controller 600 acquires data of the result of the measurement of the effective light source distribution performed by the measurement unit 500, and determines the positions of the regions in which the light intensity is low in the effective light source distribution, that is, the positions of the shadows of the light blocking members included in the light source units.

Next, in step S106, the arrangement of the light blocking members of the light source units is adjusted on the basis of the result of the evaluation performed in step S104. For example, assume that it has been determined in step S104 that a plurality of shadows of the light blocking members of the light source units overlap in the effective light source distribution. In such a case, for the light source units including the light blocking members corresponding to the overlapping shadows, the rotational angles of the light source units around the major axes of the corresponding ellipsoidal mirrors and the positions of the light blocking members are adjusted. More specifically, when it is determined that the shadow of a light blocking member included in the light source unit 1A overlaps the shadow of a light blocking member included in the light source unit 1B as a result of the evaluation performed by the controller 600, the relative position between the light blocking member of the light source unit 1A and the light blocking member of the light source unit 1B is adjusted. For example, the controller 600 issues a command to the adjusting mechanism 700A so that the position of the shadow of the light blocking member of the light source unit 1A is separated from the position of shadow of the light blocking member of the light source unit 1B, and the adjusting mechanism 700A adjusts the rotational angle of the light source unit 1A around the major axis of the corresponding ellipsoidal mirror. Alternatively, the position at which the light blocking member is arranged in the light source unit 1A may be adjusted.

Alternatively, in the evaluation process performed in step S104, the light intensity at each position may be accumulated along two perpendicular directions in the effective light source distribution to calculate accumulated intensity values. Then, in step S106, the arrangement of the light source units may be adjusted on the basis of the accumulated intensity values so as to reduce the intensity difference between the two perpendicular directions in the effective light source distribution. Alternatively, in the evaluation process performed in step S104, the total light intensity may be calculated for each of the regions into which the effective light source distribution is divided, and the differences between the light intensity distributions in the respective regions may be determined. Then, in step S106, the arrangement of the light source units may be adjusted on the basis of the differences between the light intensity distributions.

Next, in step S108, the exposure process is performed by using the adjusted effective light source distribution. In the exposure process, the mask 8 is illuminated with light, and the pattern of the mask 8 is projected onto the substrate 10 through the projection optical system 9.

The above-described adjusting method may be carried out periodically in the exposure apparatus, or be performed as a calibration process before shipping of the apparatus. According to the present embodiment, since the effective light source distribution can be measured and adjusted accuracy, uniformity of the light intensity in the effective light source distribution is improved. As a result, reduction in the resolution of the pattern of the mask due to the shadows of the light blocking members of the light source units can be more reliably suppressed.

Third Embodiment

Figure 13:
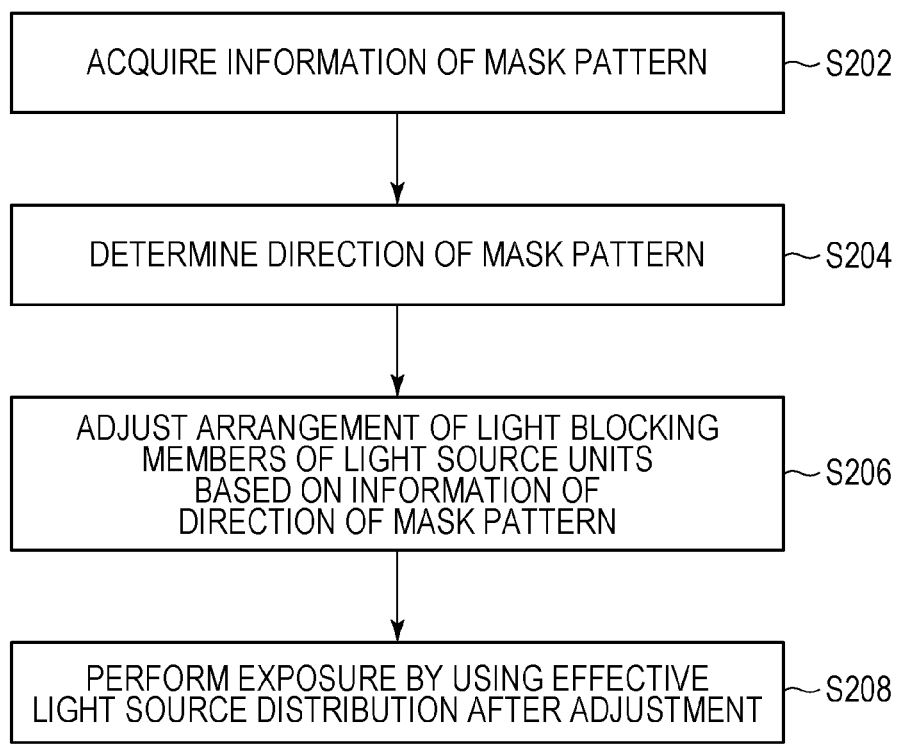
FIG. 13 is a flowchart of an adjusting method according to a third embodiment.

The structure of an exposure apparatus according to a third embodiment is similar to that in the second embodiment, and descriptions thereof are thus omitted. In the present embodiment, the adjusting method differs from that in the second embodiment. FIG. 13 is a flowchart of the adjusting method according to the third embodiment.

Figure 14A:
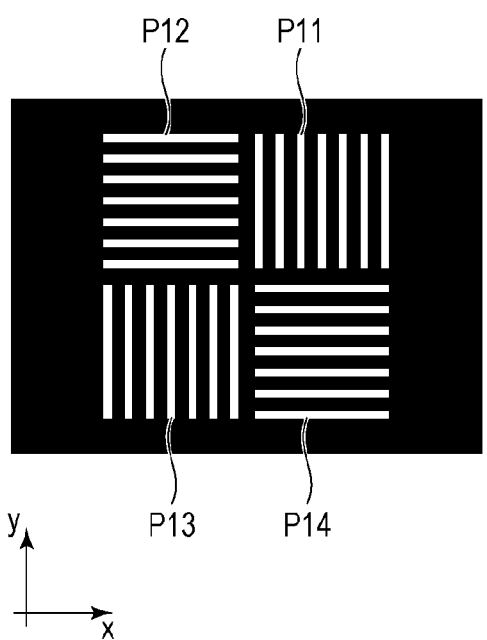
FIGS. 14A and 14B illustrate a pattern of a mask.
Figure 14B:
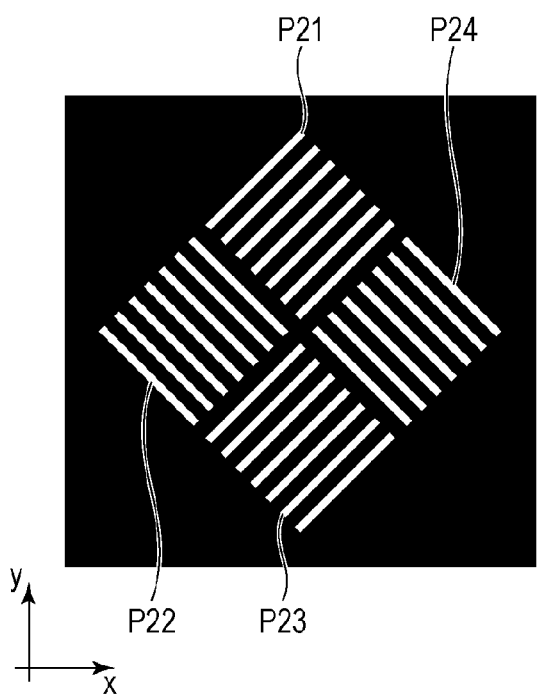

First, in step S202, the controller 600 of the exposure apparatus acquires information of the pattern of the mask 8. The information of the pattern of the mask 8 may be input by a user through an input device, or be automatically input from an external device. Next, in step S204, the controller 600 determines a direction of at least one pattern element on the mask 8 on the basis of the information of the pattern of the mask 8. FIGS. 14A and 14B illustrate examples of patterns of the mask 8. The mask illustrated in FIG. 14A includes line pattern elements P11 and P13 including lines that are periodically arranged in an x direction and extend in a y direction, and line pattern elements P12 and P14 including lines that are periodically arranged in the y direction and extend in the x direction. The mask illustrated in FIG. 14B includes pattern elements P21 to P24 including lines that are periodically arranged and extend at an angle of 45° with respect to the x and y directions. The periodic direction or the direction in which the lines extend in each pattern element is defined as the direction of the pattern element on the mask.

Figure 15A:
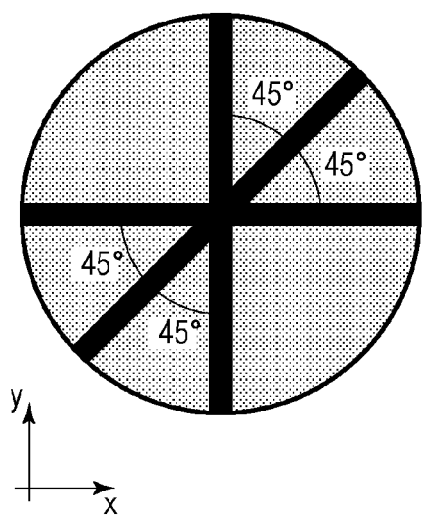
FIGS. 15A and 15B illustrate an effective light source distribution.
Figure 15B:
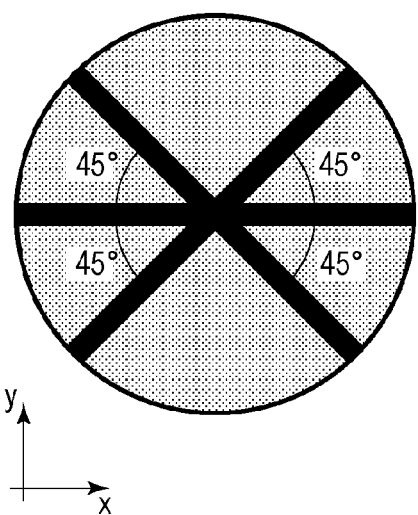

Next, the arrangement of the light blocking members included in the light source units is adjusted on the basis of the information of the direction determined in step S206. In the case where the mask includes pattern elements that are periodic in the x or y direction, as in the mask illustrated in FIG. 14A, light diffracted in the x or y direction is emitted from the mask toward the projection optical system 9, and the diffracted light is focused on the substrate 10. Therefore, it is more desirable to illuminate the mask with light having an effective light source distribution including shadows of the light blocking members that extend in the x or y direction, as illustrated in FIG. 15A, than to illuminate the mask with light having the effective light source distribution illustrated in FIG. 15B. In FIGS. 15A and 15B, black regions in the effective light source distributions are the shadows of the light blocking members included in the light source units. In the case where the mask includes pattern elements that are periodic in an oblique direction, as in the mask illustrated in FIG. 14B, light diffracted in the oblique direction is emitted from the mask toward the projection optical system 9, and the diffracted light is focused on the substrate 10. Therefore, it is more desirable to illuminate the mask with light having an effective light source distribution including shadows of the light blocking members that extend in the oblique direction, as illustrated in FIG. 15B, than to illuminate the mask with light having the effective light source distribution illustrated in FIG. 15A. This is because when the light intensity or the shadows are not uniform in the effective light source distribution, the imaging performance of the diffracted light varies depending on the direction in which the diffracted light is generated, and the resolution on the substrate varies accordingly. To obtain satisfactory resolution with a mask including a plurality of periodic pattern elements having different periodic directions, the mask may be illuminated with light having an effective light source distribution in which the imaging performance of the diffracted light does not vary even when the periodic pattern elements have different periodic directions (that is, directions in which the diffracted light is generated).

The arrangement of the light blocking members of the light source units is adjusted by, for example, adjusting the attachment positions and angles of the light source units 1A, 1B, and 1C with the adjusting mechanisms. Thus, in accordance with the pattern of the mask, the positions of the shadows of the light blocking members of the light source units in the effective light source distribution are changed so that desirable resolution can be achieved. For example, when the mask has the pattern illustrated in FIG. 14A, the arrangement of the light blocking members of the light source units is adjusted so that the effective light source distribution illustrated in FIG. 15A is obtained. When the mask has the pattern illustrated in FIG. 14B, the arrangement of the light blocking members of the light source units is adjusted so that the effective light source distribution illustrated in FIG. 15B is obtained. To confirm the result of the adjustment of the light source units 1A, 1B, and 1C, the measurement of the effective light source distribution and the adjustment of the effective light source distribution according to the second embodiment may be additionally performed.

In the present embodiment, the adjustment is performed for the case in which the mask includes two types of pattern elements having different periodic directions. However, the present embodiment is also applicable to various other types of pattern elements.

According to the present embodiment, even when the effective light source distribution includes the shadows of the light blocking members included in the light source units, reduction in the resolution of the pattern of the mask can be suppressed by using an effective light source distribution suitable for the pattern of the mask.

In the above-described embodiments, the mercury lamp 51 is used as the light source. However, the type of the light source is not limited to this. In addition, the mirror is not limited to an ellipsoidal mirror, and may instead be a paraboloid mirror or a mirror obtained by arranging flat mirrors. There is no particular limitation regarding the shape of the effective light source distribution, and various types of illumination, such as annular illumination or multipole illumination, may be used. In addition, the exposure apparatus may either be a scanning exposure apparatus in which the exposure process is performed while the stage that holds the mask and the stage that holds the substrate are moved, or a stepper in which the pattern of the mask is transferred onto the substrate by full-plate exposure.

The illumination devices according to the above-described embodiments may be applied to apparatuses other than an exposure apparatus. For example, the illumination devices may be used as an illumination device for a liquid crystal projector.

Fourth Embodiment

A method for manufacturing an object (a semiconductor IC device, a liquid crystal display device, a color panel, etc.) by using the above-described exposure apparatus will now be described. The object is formed by a step of subjecting a substrate (wafer, glass substrate, etc.), on which a photosensitive material is applied, to exposure by using the above-described exposure apparatus, a step of developing the substrate (photosensitive material), and other known steps. The other steps include, for example, processes such as etching, resist separation, dicing, bonding, and packaging. With the method for manufacturing an object according to the present embodiment, compared to a method according to the related art, an object of higher quality can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-124752 filed Jun. 17, 2014, which is hereby incorporated by reference herein in its entirety.

What is claimed is:

1. An illumination device that illuminates an illumination surface, comprising:
a plurality of light source units, each including a light source, a mirror that reflects light from the light source, and one or more light blocking members that block the light that is reflected by the mirror and travels toward the illumination surface; and
an illumination optical system that forms a light intensity distribution of superposed light, in which the light from each of the light source units is superposed, in a pupil plane and illuminates the illumination surface with the superposed light,
wherein, in the light intensity distribution in the pupil plane of the illumination optical system, positions of shadows of all of the light blocking members included in one of the light source units are separated from positions of shadows of all of the light blocking members included in at least one of the remaining light source units.

2. The illumination device according to claim 1, wherein, in the light intensity distribution in the pupil plane of the illumination optical system, positions of shadows of all of the light blocking members included in all of the light source units are separated from each other.

3. The illumination device according to claim 1, wherein, when n is the number of shadows of the light blocking members of the light source units in the light intensity distribution in the pupil plane of the illumination optical system, each of n regions into which the pupil plane of the illumination optical system is divided such that the n regions each have a central angle of 360°/n has one of the shadows of the light blocking members disposed therein.

4. The illumination device according to claim 1, wherein, when n is the number of shadows of the light blocking members of the light source units in the light intensity distribution in the pupil plane of the illumination optical system, positions of the shadows of the light blocking members of the light source units are separated from each other by a central angle of 180°/n or more.

5. The illumination device according to claim 1, wherein, in the light intensity distribution in the pupil plane of the illumination optical system, the positions of the shadows of the light blocking members of the light source units are separated from each other by an equal central angle.

6. The illumination device according to claim 1, further comprising:
an adjusting unit that adjusts an arrangement of the light blocking members of the light source units so that, in the light intensity distribution in the pupil plane of the illumination optical system, the positions of the shadows of the light blocking members are separated from each other.

7. The illumination device according to claim 1, wherein, in each of the light source units, the one or more light blocking members include a cable connected to an electrode of the light source.

8. The illumination device according to claim 1, wherein, in each of the light source units, the one or more light blocking members include a cooling nozzle for cooling an electrode of the light source.

9. The illumination device according to claim 1, wherein, in each of the light source units, the one or more light blocking members include a member in which a cable connected to an electrode of the light source and a cooling nozzle for cooling the electrode of the light source are integrated with each other.

10. The illumination device according to claim 1, wherein, in each of the light source units, the one or more light blocking members include, as separate components, a cable connected to an electrode of the light source and a cooling nozzle for cooling the electrode of the light source, and wherein, in the light intensity distribution in the pupil plane of the illumination optical system, a shadow of the cable included in one of the light source units overlaps a shadow of the cooling nozzle included in the one of the light source units.

11. The illumination device according to claim 10, wherein, in the light intensity distribution in the pupil plane of the illumination optical system, the shadow of the cable included in the one of the light source units and the shadow of the cooling nozzle included in the one of the light source units have the same width.

12. An exposure apparatus that transfers a pattern of a mask onto a substrate by exposure, the exposure apparatus comprising:
the illumination device according to claim 1 that illuminates the mask; and
a projection optical system that projects the pattern of the mask illuminated by the illumination device onto the substrate.

13. An illumination device that illuminates an illumination surface, comprising:
a plurality of light source units, each including a light source, a mirror that reflects light from the light source, and one or more light blocking members that block the light that is reflected by the mirror and travels toward the illumination surface;
an illumination optical system that forms a light intensity distribution of superposed light, in which the light from each of the light source units is superposed, in a pupil plane and illuminates the illumination surface with the superposed light;
a measurement unit that measures the light intensity distribution in the pupil plane of the illumination optical system; and
an adjusting unit that adjusts an arrangement of the light blocking members based on positions of shadows of the light blocking members in the light intensity distribution measured by the measurement unit.

14. The illumination device according to claim 13, wherein the adjusting unit adjusts the arrangement of the light blocking members so that, in the light intensity distribution in the pupil plane of the illumination optical system, positions of shadows of all of the light blocking members included in one of the light source units are separated from positions of shadows of all of the light blocking members included in at least one of the remaining light source units.

15. The illumination device according to claim 13, wherein the adjusting unit adjusts the arrangement of the light blocking members so as to reduce an intensity difference between two perpendicular directions in the light intensity distribution in the pupil plane of the illumination optical system.

16. An exposure apparatus that transfers a pattern of a mask onto a substrate by exposure, the exposure apparatus comprising:
the illumination device according to claim 13 that illuminates the mask; and
a projection optical system that projects the pattern of the mask illuminated by the illumination device onto the substrate.

17. An adjusting method for an illumination device including a plurality of light source units and an illumination optical system, each light source unit including a light source, a mirror that reflects light from the light source, and one or more light blocking members that block the light that is reflected by the mirror and travels toward an illumination surface, the illumination optical system forming a light intensity distribution of superposed light, in which the light from each of the light source units is superposed, in a pupil plane and illuminating the illumination surface with the superposed light, the adjusting method comprising the steps of:
measuring the light intensity distribution in the pupil plane of the illumination optical system; and
adjusting an arrangement of the light blocking members based on positions of shadows of the light blocking members in the measured light intensity distribution.

18. An adjusting method for an exposure apparatus that transfers a pattern of a mask onto a substrate by exposure and that includes a plurality of light source units and an illumination optical system, each light source unit including a light source, a mirror that reflects light from the light source, and one or more light blocking members that block the light that is reflected by the mirror and travels toward the mask, the illumination optical system forming a light intensity distribution of superposed light, in which the light from each of the light source units is superposed, in a pupil plane and illuminating the mask with the superposed light, the adjusting method comprising the step of:
adjusting positions of shadows of the light blocking members in the light intensity distribution based on information of the pattern of the mask.

19. The adjusting method according to claim 18, further comprising the step of:
acquiring information of a direction of the pattern of the mask,
wherein, in the adjusting step, the positions of shadows of the light blocking members are adjusted based on the acquired information of the direction of the pattern of the mask.

20. The adjusting method according to claim 18, wherein the pattern of the mask includes a plurality of periodic pattern elements having different periodic directions.

21. A method for manufacturing an object, comprising the steps of:
performing an exposure process on a substrate by using an exposure apparatus that transfers a pattern of a mask onto the substrate by exposure and that includes an illumination device that illuminates the mask and a projection optical system that projects the pattern of the mask illuminated by the illumination device onto the substrate;
developing the substrate that has been subjected to the exposure process; and
manufacturing the object by processing the developed substrate, wherein the illumination device includes
a plurality of light source units, each including a light source, a mirror that reflects light from the light source, and one or more light blocking members that block the light that is reflected by the mirror and travels toward the mask, and
an illumination optical system that forms a light intensity distribution of superposed light, in which the light from each of the light source units is superposed, in a pupil plane and illuminates the mask with the superposed light, and
wherein, in the light intensity distribution in the pupil plane of the illumination optical system, positions of shadows of all of the light blocking members included in one of the light source units are separated from positions of shadows of all of the light blocking members included in at least one of the remaining light source units.

22. A method for manufacturing an object, comprising the steps of:
performing an exposure process on a substrate by using an exposure apparatus that transfers a pattern of a mask onto the substrate by exposure and that includes an illumination device that illuminates the mask and a projection optical system that projects the pattern of the mask illuminated by the illumination device onto the substrate;
developing the substrate that has been subjected to the exposure process; and
manufacturing the object by processing the developed substrate,
wherein the illumination device includes
a plurality of light source units, each including a light source, a mirror that reflects light from the light source, and one or more light blocking members that block the light that is reflected by the mirror and travels toward the mask;
an illumination optical system that forms a light intensity distribution of superposed light, in which the light from each of the light source units is superposed, in a pupil plane and illuminates the mask with the superposed light;
a measurement unit that measures the light intensity distribution in the pupil plane of the illumination optical system; and
an adjusting unit that adjusts an arrangement of the light blocking members based on positions of shadows of the light blocking members in the light intensity distribution measured by the measurement unit.

* * * * *